(12) United States Patent
Xu et al.

(10) Patent No.: US 12,392,348 B2
(45) Date of Patent: Aug. 19, 2025

(54) FAN ASSEMBLY

(71) Applicant: COOLER MASTER CO., LTD., Taipei (TW)

(72) Inventors: Shi-Man Xu, Taipei (TW); Jiasheng Lai, Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 0 days.

(21) Appl. No.: 18/376,806

(22) Filed: Oct. 4, 2023

(65) Prior Publication Data

US 2024/0271628 A1 Aug. 15, 2024

(30) Foreign Application Priority Data

Feb. 10, 2023 (CN) .......................... 202310101511.1

(51) Int. Cl.
*F04D 25/06* (2006.01)
*F04D 19/00* (2006.01)
*F04D 29/52* (2006.01)
*F04D 29/60* (2006.01)
*F04D 25/16* (2006.01)
*H05K 7/20* (2006.01)

(52) U.S. Cl.
CPC ....... *F04D 25/0693* (2013.01); *F04D 19/002* (2013.01); *F04D 29/522* (2013.01); *F04D 29/601* (2013.01); *F04D 25/0613* (2013.01); *F04D 25/166* (2013.01); *H05K 7/20172* (2013.01)

(58) Field of Classification Search
CPC .............. F04D 19/002; F04D 25/0613; F04D 25/0693; F04D 29/522; F04D 29/601; F04D 25/166; F04D 29/4226; F04D 29/4253; F04D 29/60–603; F04D 29/646; H05K 7/20172; G06F 1/20
See application file for complete search history.

(56) References Cited

U.S. PATENT DOCUMENTS 6,053,198 A * 4/2000 Atkin .................. F15B 13/0864
  137/271
10,736,232 B1 * 8/2020 Ou ..................... H05K 7/20172
  (Continued)

OTHER PUBLICATIONS

McMaster catalog 114 pp. 734-736 (Year: 2008).*

*Primary Examiner* — Essama Omgba
*Assistant Examiner* — Joseph S. Herrmann
(74) *Attorney, Agent, or Firm* — Merchant & Gould P.C.

(57) ABSTRACT

A fan assembly including at least one fan device and a first attachment device. The at least one fan device includes a frame, an impeller, a driving component and at least one in-built electrical port. The impeller is rotatably disposed at the frame. The driving component is configured to drive the impeller to rotate relative to the frame. The at least one in-built electrical port is disposed at the frame and electrically connected to the driving component. The first attachment device includes a first casing, a first external electrical port and a terminal cable. The first casing is detachably mounted at the frame. The first external electrical port is disposed at the first casing and detachably assembled with the at least one in-built electrical port. An end of the terminal cable is electrically connected to the first external electrical port.

8 Claims, 10 Drawing Sheets

(56) References Cited

U.S. PATENT DOCUMENTS

| | | | |
|---|---|---|---|
| 11,686,467 B1* | 6/2023 | Yuan | F04D 25/166 |
| | | | 362/96 |
| 2007/0176502 A1* | 8/2007 | Kasai | H02K 5/225 |
| | | | 310/71 |
| 2017/0331346 A1* | 11/2017 | Lai | F04D 25/0693 |
| 2020/0395697 A1* | 12/2020 | Chen | H01R 12/73 |
| 2021/0018009 A1* | 1/2021 | Hsieh | F04D 25/0693 |
| 2024/0172390 A1* | 5/2024 | Hatol | F04D 29/602 |

* cited by examiner

FAN ASSEMBLY

CROSS-REFERENCE TO RELATED APPLICATIONS

This non-provisional application claims priority under 35 U.S.C. § 119(a) on Patent Application No(s). 202310101511.1 filed in China, on Feb. 10, 2023, the entire contents of which are hereby incorporated by reference.

TECHNICAL FIELD

The present disclosure relates to a fan assembly, more particularly to a fan assembly having an attachment device.

BACKGROUND

With the rapid development of technology, the computation performance of processors of an electronic product has also improved significantly, while a large amount of heat has been generated at the same time. In order to ensure that the processors will not be damaged due to high temperature, a fan is generally provided in the electronic product to cool the processors, so that the processors can operate within an adequate temperature range.

The quantity of the fans may be selected according to a heat dissipation requirement of the processors of the electronic product. However, when multiple fans are adopted, an inner space of a casing of the electronic product needs to accommodate not only the fans but also cables provided with the fans, causing the fans to be difficult to be mounted in the casing. Therefore, how to accommodate the fans in the casing of the electronic product is an important issue to be solved.

SUMMARY

The present disclosure provides a fan assembly capable of being accommodated in the casing of the electronic product.

One embodiment of the disclosure provides a fan assembly including at least one fan device and a first attachment device. The at least one fan device includes a frame, an impeller, a driving component and at least one in-built electrical port. The impeller is rotatably disposed at the frame. The driving component is configured to drive the impeller to rotate relative to the frame. The at least one in-built electrical port is disposed at the frame and electrically connected to the driving component. The first attachment device includes a first casing, a first external electrical port and a terminal cable. The first casing is detachably mounted at the frame. The first external electrical port is disposed at the first casing and detachably assembled with the at least one in-built electrical port. An end of the terminal cable is electrically connected to the first external electrical port.

According to the fan assembly as described in the above embodiments, the first attachment device can be detachably mounted at the fan device, such that when multiple fans are desired to be accommodated in a casing, the first attachment device is required to be merely mounted at corresponding one corner of one of the fan devices so as to provide power and control signals to all of the fan devices. Therefore, the quantity of the terminal cable can be reduced, so that the fan assembly can be easily accommodated in a casing.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1:
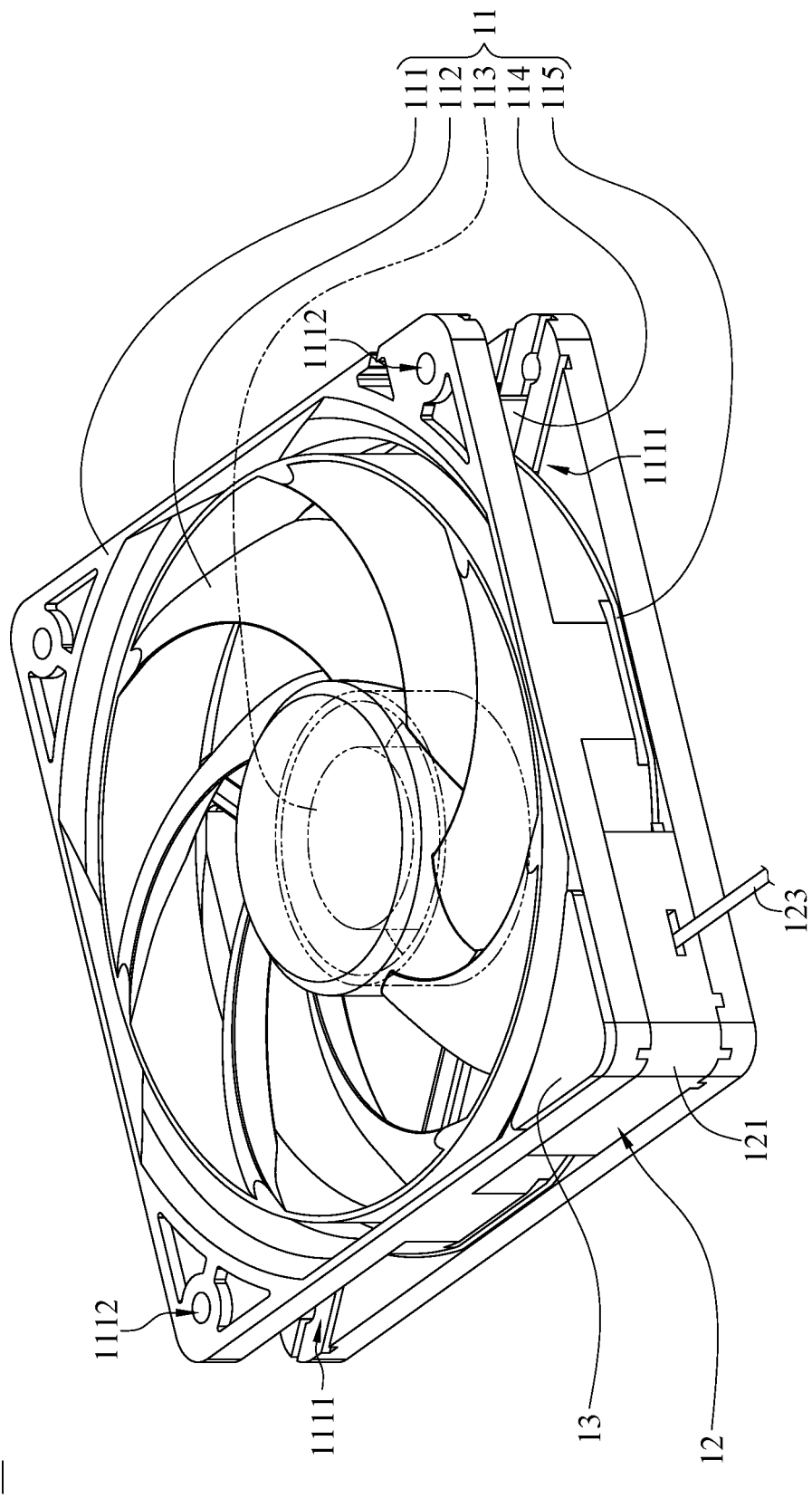
FIG. 1 is a perspective view of a fan assembly in accordance with a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
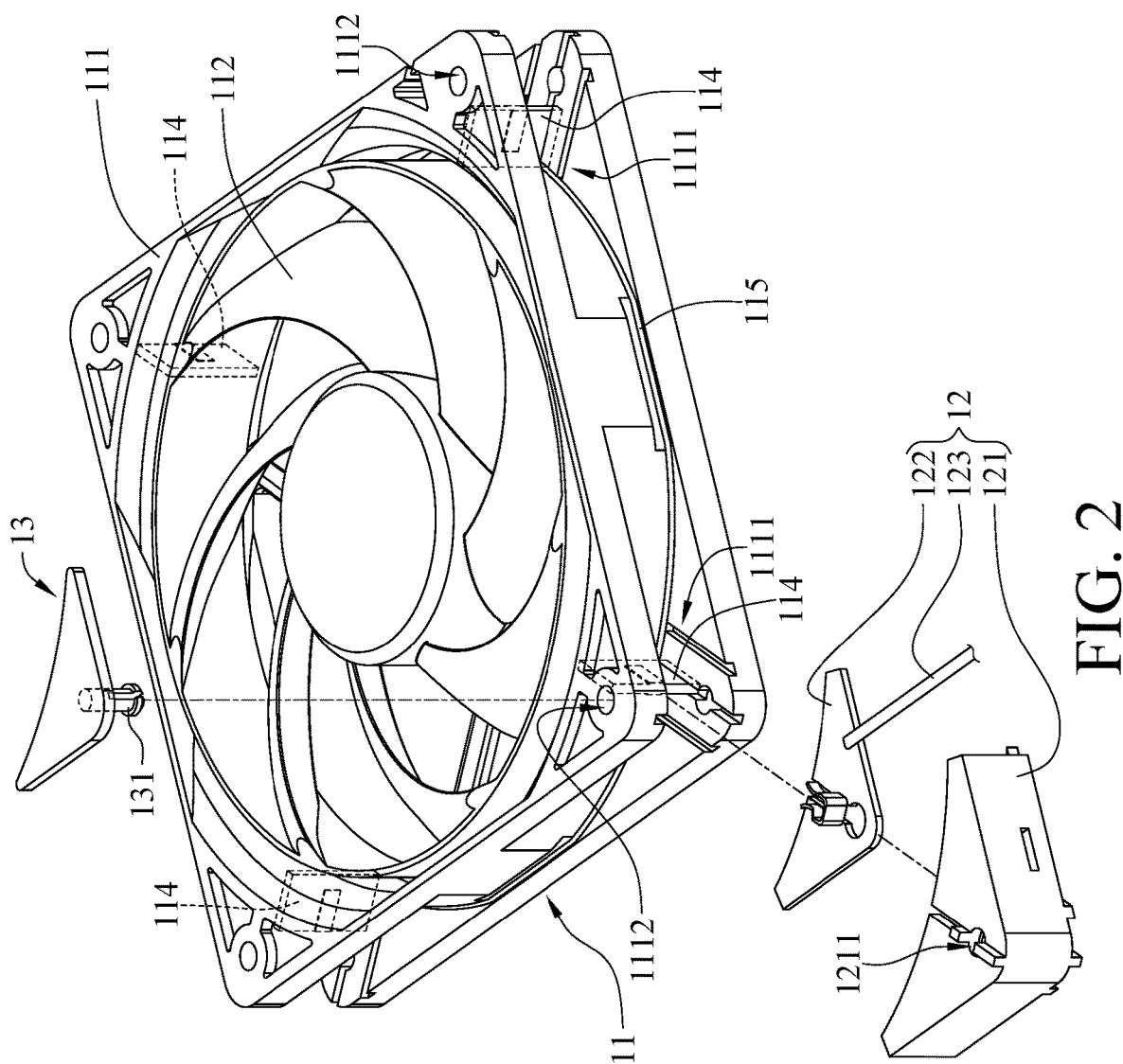
FIG. 2 is an exploded view of the fan assembly in FIG. 1.
Figure 3:
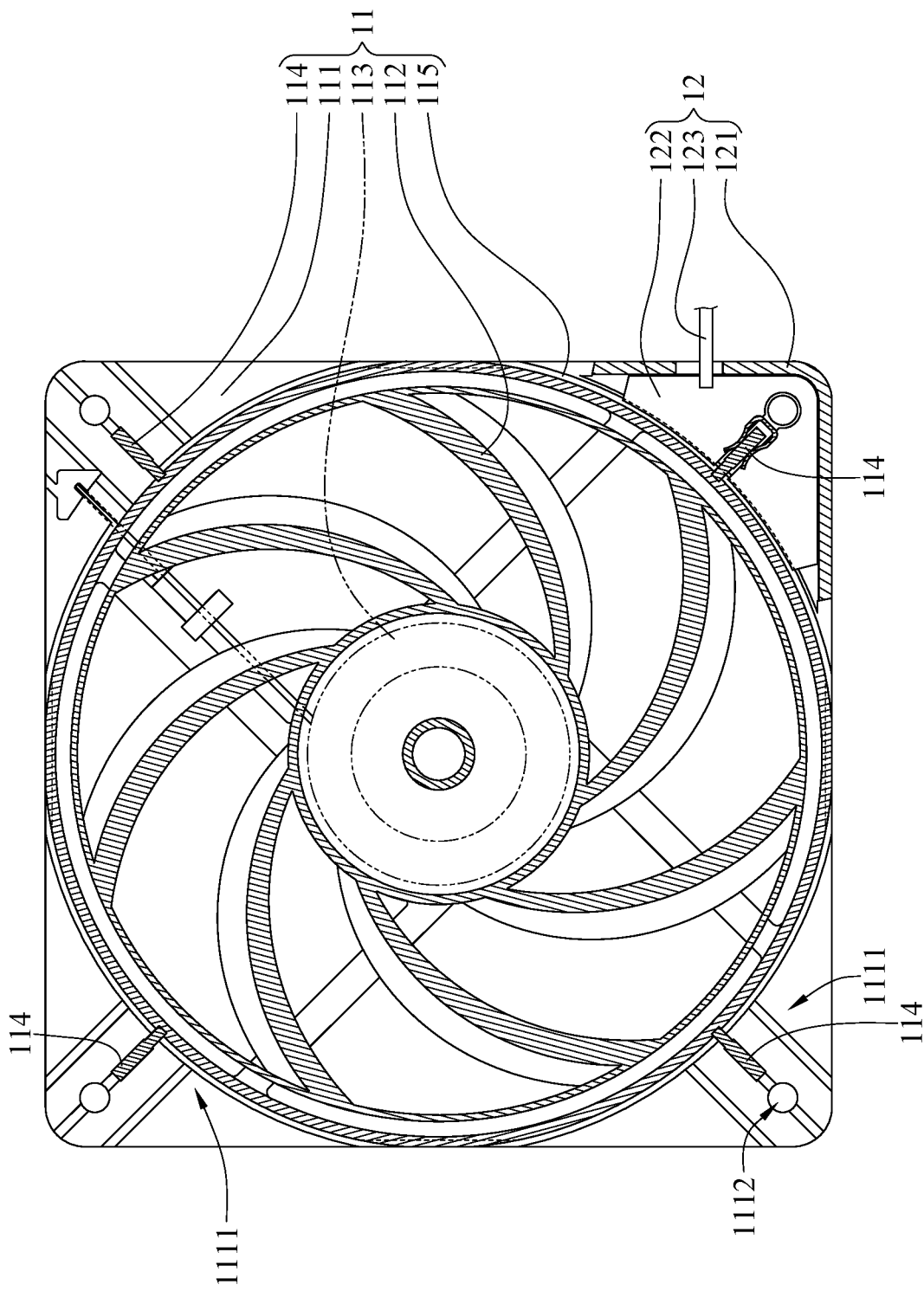
FIG. 3 is a cross-sectional view of the fan assembly in FIG. 1.
Figure 4:
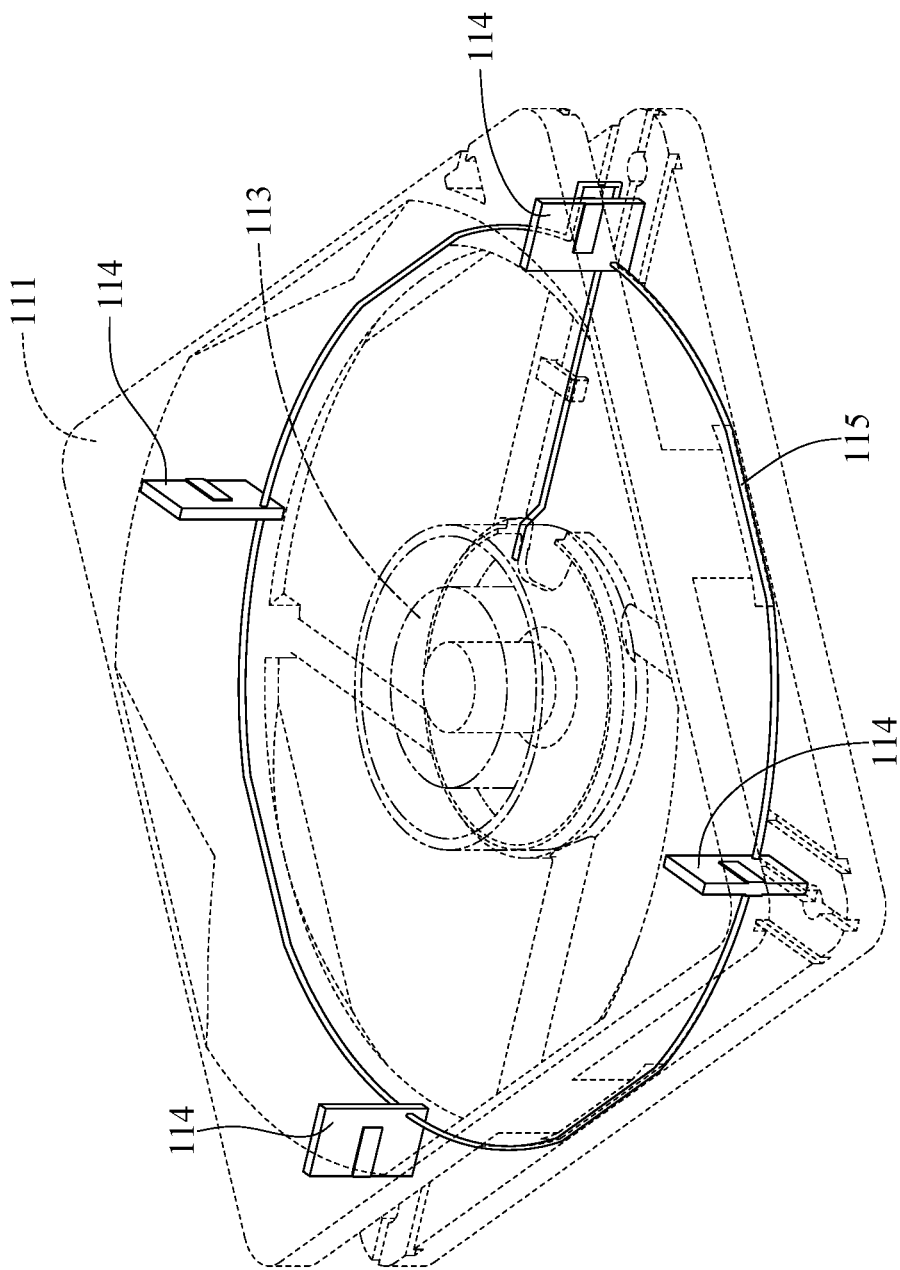
FIG. 4 is a partial perspective view of the fan assembly in FIG. 1.

Please refer to FIG. 1 to FIG. 4, where FIG. 1 is a perspective view of a fan assembly 10 in accordance with a first embodiment of the disclosure, FIG. 2 is an exploded view of the fan assembly 10 in FIG. 1, FIG. 3 is a cross-sectional view of the fan assembly 10 in FIG. 1, and FIG. 4 is a partial perspective view of the fan assembly 10 in FIG. 1.

In this embodiment, the fan assembly 10 includes a fan device 11, a first attachment device 12 and a single fastener 13. The fan device 11 includes a frame 111, an impeller 112, a driving component 113, four in-built electrical ports 114 and a connection cable 115. Each of four corners of the frame 111 has an installation space 1111. The impeller 112 is rotatably disposed at the frame 111. The driving component 113 includes a stator (not shown) and a rotor (not shown). The stator and a rotor are, for example, magnets or coils matched with each other. The stator is fixed on the frame 111. The rotor is rotatable relative to the stator via an electromagnetic effect therebetween. The driving component 113 is configured to drive the impeller 112 to rotate relative to the frame 111. The four in-built electrical ports 114 are, for example, circuit boards having conductive metal pads. The four in-built electrical ports 114 are, for example, disposed in the four installation spaces 1111 of the frame 111, respectively, and the four in-built electrical ports 114 are electrically connected to the driving component 113 via the connection cable 115.

The first attachment device 12 includes a first casing 121, a first external electrical port 122 and a terminal cable 123. The first casing 121 is detachably mounted in one of the installation spaces 1111 of the frame 111. The first external electrical port 122 is, for example, a circuit board having a conductive metal clip. The first external electrical port 122 is disposed in the first casing 121, and is detachably assembled with one of the in-built electrical ports 114. An end of the terminal cable 123 is electrically connected to the first external electrical port 122, and another end of the terminal cable 123 is electrically connected to an external power source (not shown). That is, the fan device 11 can receive a power or control signals via the first attachment device 12.

In this embodiment, the first casing 121 of the first attachment device 12 is mounted in one of the installation spaces 1111 of the frame 111, such that the first casing 121 can be entirely fitted in the frame 111 without protruding from the frame 111. Therefore, a space occupied by the fan assembly 10 can be reduced.

In addition, the frame 111 has a plurality of through holes 1112. The first casing 121 of the first attachment device 12 has a first insertion hole 1211. The single fastener 13 has an engagement protrusion 131. The engagement protrusion 131 is disposed through one of the through holes 1112 of the frame 111 and the first insertion hole 1211 of the first casing 121 so as to fix the first casing 121 in the frame 111. That is, the first attachment device 12 is fixed in the frame 111 via the single fastener 13.

In this embodiment, all of the four in-built electrical ports 114 are electrically connected to the driving component 113 via the connection cable 115. As a result, the first attachment device 12 can be mounted in any one of the installation spaces 1111 of the fan device 11 for electrically connecting the in-built electrical port 114 in such installation space 1111 with the first external electrical port 122, such that the power or the control signals can be provided to the fan device 11 for driving the fan device 11.

Figure 5:
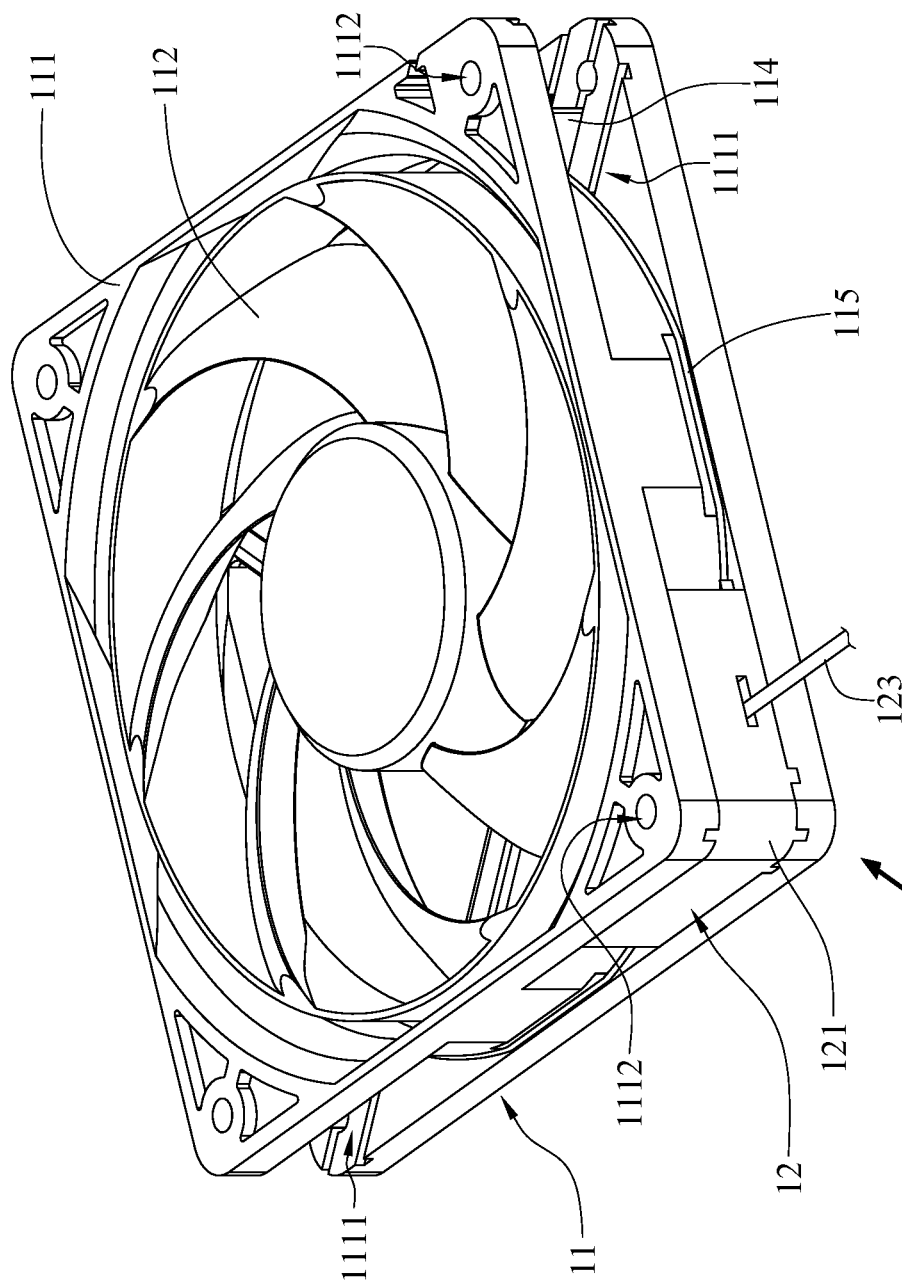
FIG. 5 is a perspective view showing that a first attachment device is mounted at the fan device in FIG. 1.
Figure 6:
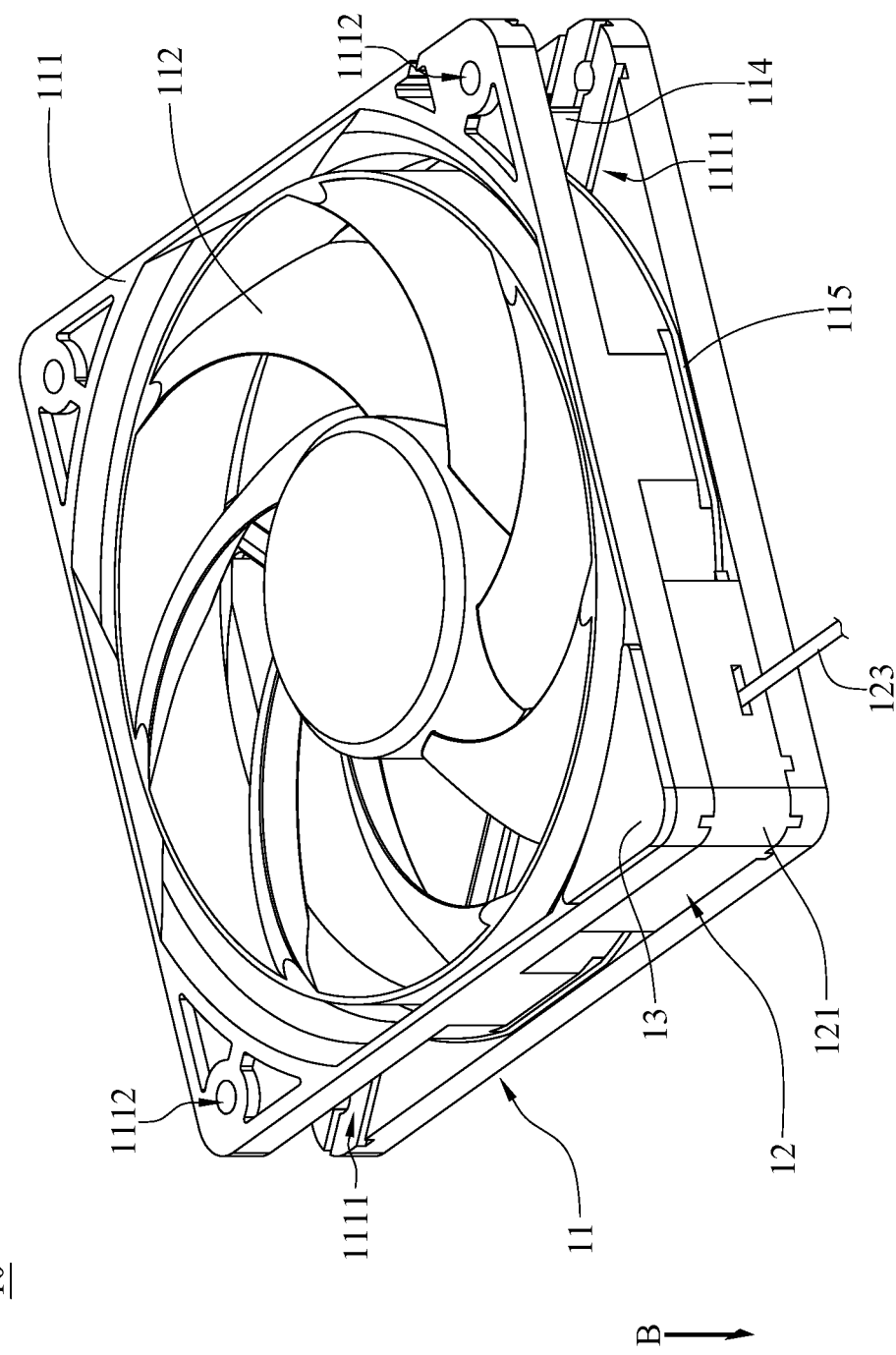
FIG. 6 is a perspective view showing that a single fastener is mounted at the fan device in FIG. 1.

Please refer to FIG. 5 and FIG. 6, where FIG. 5 is a perspective view showing that the first attachment device 12 is mounted at the fan device 11 in FIG. 1, and FIG. 6 is a perspective view showing that the single fastener 13 is mounted at the fan device 11 in FIG. 1.

In this embodiment, during the installation of the first attachment device 12 into the frame 111, the first step is to place the first attachment device 12 into one of the installation spaces 1111 of the frame 111 along a direction A, such that the first external electrical port 122 of the first attachment device 12 is assembled with the in-built electrical port 114 located in this installation space 1111. Then, the second step is to insert the engagement protrusion 131 of the single fastener 13 through the through hole 1112 connected to this installation space 1111 and into the first insertion hole 1211 of the first casing 121 of the first attachment device 12 so as to fix the first casing 121 of the first attachment device 12 in the frame 111. Then, the third step is to connect the terminal cable 123 of the first attachment device 12 with the external power source. Accordingly, the power or the control signals can be transmitted to the fan device 11 via the terminal cable 123 and the first external electrical port 122 of the first attachment device 12 so as to drive the fan device 11 to operate.

Figure 7:
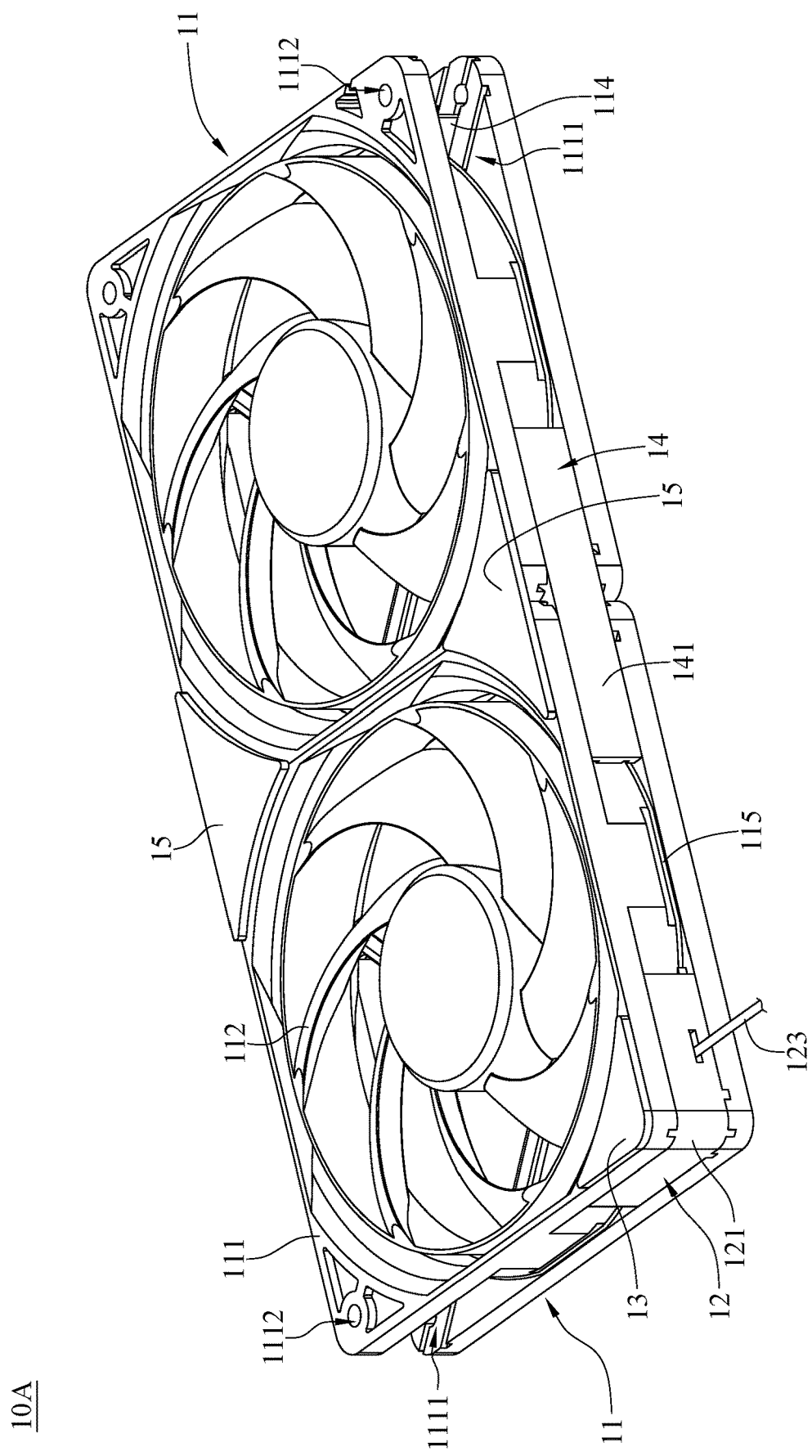
FIG. 7 is a perspective view of a fan assembly in accordance with a second embodiment of the disclosure.
Figure 8:
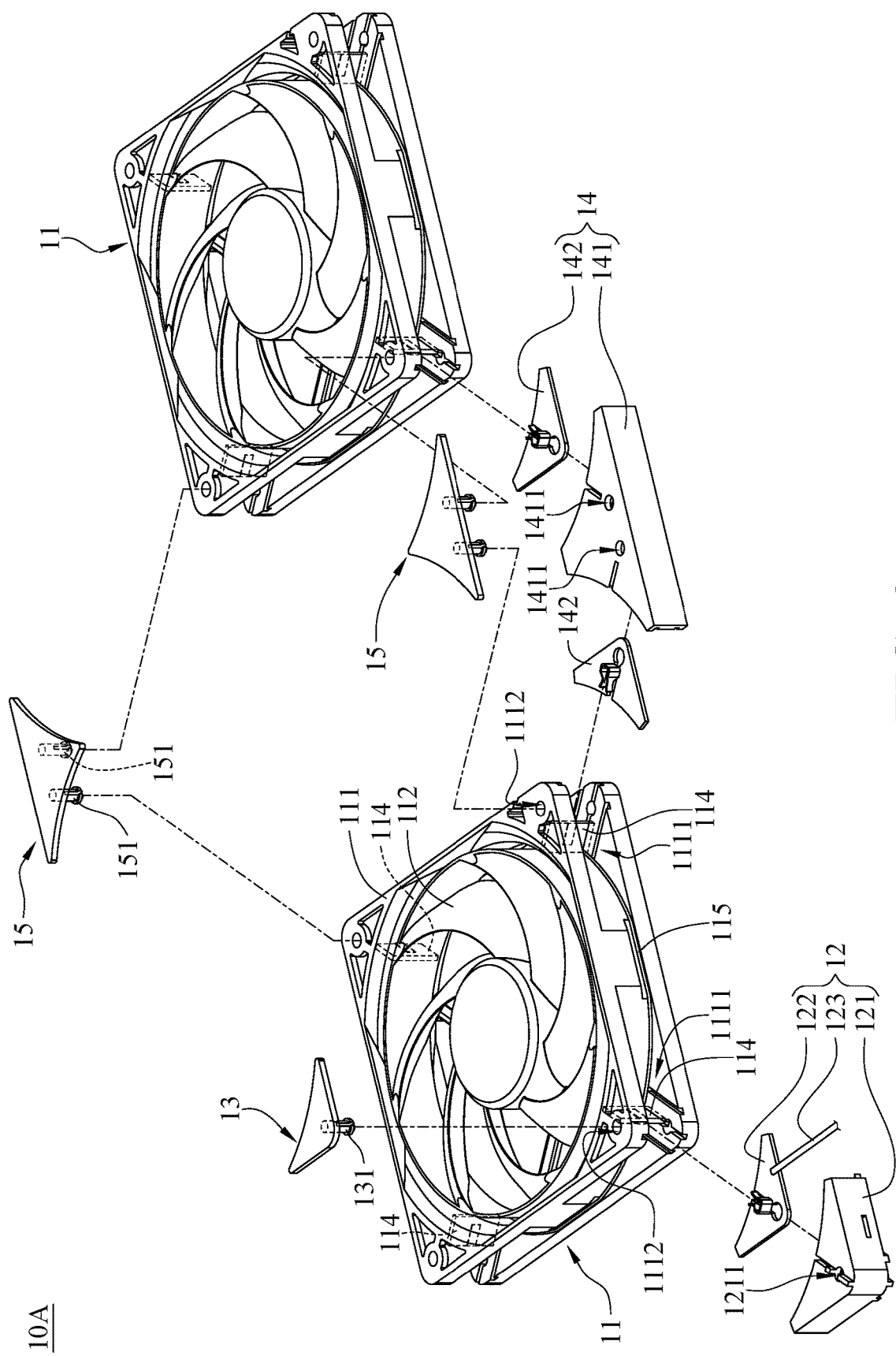
FIG. 8 is an exploded view of the fan assembly in FIG. 7.

Please refer to FIG. 7 and FIG. 8, where FIG. 7 is a perspective view of a fan assembly 10A in accordance with a second embodiment of the disclosure, and FIG. 8 is an exploded view of the fan assembly 10A in FIG. 7.

The fan assembly 10A of this embodiment is similar to the fan assembly 10 of the first embodiment, the main difference between them will be described below, and the same parts between them can be referred to the aforementioned paragraphs with the reference to FIG. 1 to FIG. 6 and will not be repeatedly introduced hereinafter. In this embodiment, the fan assembly 10A includes two fan devices 11, a first attachment device 12, a second attachment device 14 and two double fasteners 15. The fan devices 11 are arranged side by side. The first attachment device 12 is mounted in one of the installation spaces 1111 of one of the fan devices 11 located farther away from the other fan devices, and transmits the power or the control signals to the fan devices 11 via electrical connection between the external power source and the first attachment device 12. The second attachment device 14 includes a second casing 141 and two second external electrical ports 142. The second casing 141 is detachably mounted in two installation spaces 1111 of the frames 111 of the fan devices 11 located adjacent to each other, such that the second casing 141 is located at one side of the two fan devices 11 connected to each other. The two second external electrical ports 142 are, for example, circuit boards having conductive metal clips. The two second external electrical ports 142 are detachably assembled with two of the in-built electrical ports 114 in the two installation spaces 1111 of the frames 111, respectively, and the two second external electrical ports 142 are connected to each other via, for example, a connection cable (not shown). Accordingly, after the first attachment device 12 receives the power or the control signals and transmits it or them to one of the fan devices 11, the two second external electrical ports 142 transmit the power or the control signals to the other fan device 11, thereby driving the two fan devices 11 to operate simultaneously.

In this embodiment, the first attachment device 12 and the second attachment device 14 are entirely fitted into the installation spaces 1111 located at some corners of the frames 111 without protruding from the frames 111. Therefore, when the fan devices 11 are arranged side by side, the frames 111 can be arranged as close as possible without being interfered by the first attachment device 12 and the second attachment device 14, thereby reducing an overall size of the fan devices 11 arranged side by side.

The two double fasteners 15 are engaged with different sides of the two frames 111, respectively. Each double fastener 15 has two engagement protrusions 151. The second casing 141 has two second insertion holes 1411. The two engagement protrusions 151 of one of the double fasteners 15 are disposed through two of the through holes 1112 located on one side of the two frames 111 and the two second insertion holes 1411 of the second casing 141, respectively, so as to fix the second casing 141 in the two frames 111. The two engagement protrusions 151 of the other double fastener 15 are disposed through two of the through holes 1112 located on another side of the two frames 111. Accordingly, the two double fasteners 15 not only fix the second attachment device in the two frames 111, but also connect the two fan devices 11 more stably.

In this embodiment, the two fan devices 11 are electrically connected to each other via the two second external electrical ports 142. As a result, the first attachment device 12 can be mounted in any one of the installation spaces 1111 of the two fan devices 11 for electrically connecting the in-built electrical port 114 in such installation space 1111 with the first external electrical port 122, such that the power or the control signals can be provided to one of the fan devices 11 for driving the two fan devices 11.

In this embodiment, the second attachment device 14 includes only one second casing 141, but the disclosure is not limited thereto. In other embodiments, the second attachment device may include two second casings, and the two second casings are mounted in the two installation spaces of the frames of the fan devices located adjacent to each other.

In this embodiment, the second attachment device 14 includes two second external electrical ports 142, but the disclosure is not limited thereto. In other embodiments, the second attachment device may include only one second external electrical port integrally formed as a single piece.

Figure 9:
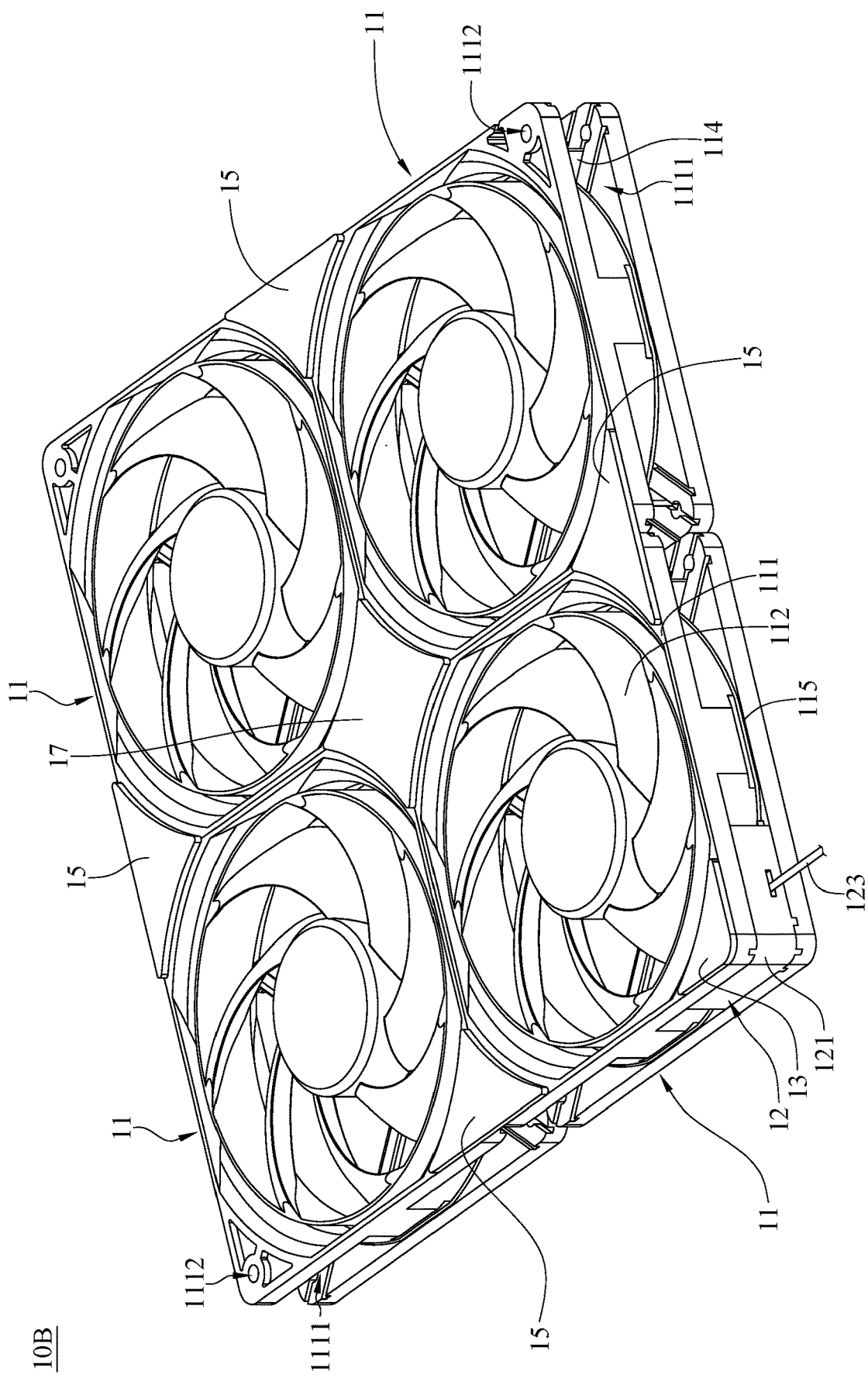
FIG. 9 is a perspective view of a fan assembly in accordance with a third embodiment of the disclosure.
Figure 10:
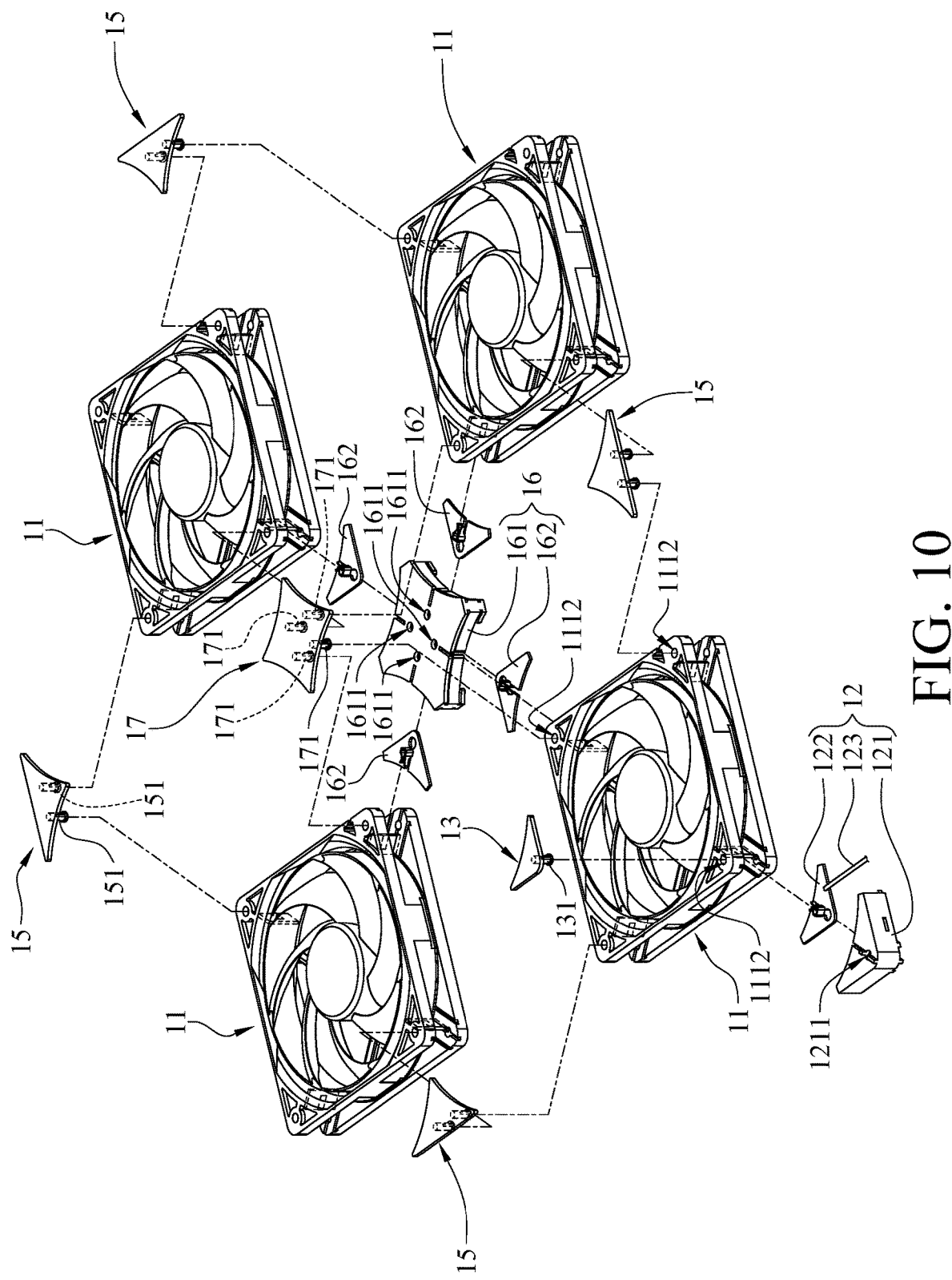
FIG. 10 is an exploded view of the fan assembly in FIG. 9.

Please refer to FIG. 9 and FIG. 10, where FIG. 9 is a perspective view of a fan assembly 10B in accordance with a third embodiment of the disclosure, and FIG. 10 is an exploded view of the fan assembly 10B in FIG. 9.

The fan assembly 10B of this embodiment is similar to the fan assembly 10 of the first embodiment, the main difference between them will be described below, and the same parts between them can be referred to the aforementioned paragraphs with the reference to FIG. 1 to FIG. 6 and will not be repeatedly introduced hereinafter. In this embodiment, the fan assembly 10B includes four fan devices 11, a first attachment device 12, a third attachment device 16, a quadruple fastener 17 and four double fasteners 15. The four fan devices 11 are, for example, arranged in 2×2 array. The first attachment device 12 is mounted in one of the installation spaces 1111 located at one corner of the fan devices 11, and transmits the power or the control signals to the fan devices 11 via electrical connection between the external power source and the first attachment device 12. The third attachment device 16 includes a third casing 161 and four third external electrical ports 162. The third casing 161 of the third attachment device 16 is detachably mounted in four installation spaces 1111 of the four frames 111 of the fan devices 11 located adjacent to one another. The four third external electrical ports 162 are, for example, circuit boards having conductive metal clips. The four third external electrical ports 162 are detachably assembled with four of the in-built electrical ports 114 located in the four installation spaces 1111 of the four frames 111, and the four third external electrical ports 162 are electrically connected to each other via, for example, a connection cable (not shown). Accordingly, after the first attachment device 12 receives the power or the control signals and transmits it or them to one of the fan devices 11, the four third external electrical ports 162 transmit the power or the control signals to the other fan device 11, thereby driving the four fan devices 11 to operate simultaneously.

In this embodiment, the first attachment device 12 and the third attachment device 16 are fitted into the installation spaces 1111 located at some corners of the four frames 111 without protruding from the frames 111. Therefore, when the fan devices 11 are arranged side by side, the frames 111 can be arranged as close as possible without being interfered by the first attachment device 12 and the third attachment device 16, thereby reducing an overall size of the fan devices 11 arranged side by side.

The quadruple fastener 17 has four engagement protrusions 171. The third casing 161 has four third insertion holes 1611. The four engagement protrusions 171 of the quadruple fastener 17 are disposed through four of the through holes 1112 connected to the four installation spaces 1111 of the four frames 111 and the four third insertion holes 1611 of the third casing 161, respectively, so as to fix the third casing 161 in the four frames 111. That is, the third casing 161 is fixed in the four frames 111 via the quadruple fastener 17. The four double fasteners 15 are engaged with different sides of the four frames 111, respectively. Each double fastener 15 has two engagement protrusions 151. The two engagement protrusions 151 of each of the four double fasteners 15 are engaged with two through holes 1112 of any two adjacent frames 111.

In addition, the four double fasteners 15 are engaged with different sides of the four frames 111, respectively. Accordingly, the four fan devices 11 can be connected more stably via the four double fasteners 15.

In this embodiment, the four fan devices 11 are electrically connected to each other via the four third external electrical ports 162. As a result, the first attachment device 12 can be mounted in any one of the installation spaces 1111 of the four fan devices 11 for electrically connecting the in-built electrical port 114 in such installation space 1111 with the first external electrical port 122, such that the power or the control signals can be provided to one of the fan devices 11 for driving the four fan devices 11.

In this embodiment, the third attachment device 16 includes four third external electrical ports 162, but the disclosure is not limited thereto. In other embodiments, the third attachment device may include only one third external electrical port integrally formed as a single piece.

In this embodiment, the fan assembly 10, 10A and 10B includes one, two and four fan device(s) 11, respectively, and the two or four fan devices can be connected to each other via the double fasteners 15 or the quadruple fastener 17, but the disclosure is not limited thereto. In other embodiments, the fan assembly may include more than four fan devices, and the fan devices can be connected to each other via the double fasteners or the quadruple fasteners.

According to the fan assembly as described in the above embodiments, the first attachment device can be detachably mounted at the fan device, such that when multiple fans are desired to be accommodated in a casing, the first attachment device is required to be merely mounted at corresponding one corner of one of the fan devices so as to provide power and control signals to all of the fan devices. Therefore, the quantity of the terminal cable can be reduced, so that the fan assembly can be easily accommodated in a casing.

In addition, when the fan devices are assembled with each other according to heat dissipation requirement of an electronic product, the first attachment device can be mounted at one of the fan devices and the second attachment device or the third attachment device can be mounted between the fan devices, and the fan devices are electrically connected to each other via the second attachment device or the third attachment device. Accordingly, one of the fan devices can receive the external power or the control signals via the first attachment device, and the second attachment device or the third attachment device can transmit the power or the control signals to the other fan devices. Therefore, the power and the control signals are provided to all the fan devices via only one external cable without connecting a multiple cables to occupy space.

In addition, the first attachment device, the second attachment device and the third attachment device are fitted into the installation spaces located at some corners of the frames without protruding from the frames. Therefore, when the fan devices are arranged side by side, the frames can be arranged as close as possible without being interfered by the attachment devices, thereby reducing an overall size of the fan devices arranged side by side.

It will be apparent to those skilled in the art that various modifications and variations can be made to the present disclosure. It is intended that the specification and examples be considered as exemplary embodiments only, with a scope of the disclosure being indicated by the following claims.

What is claimed is:

1. A fan assembly, comprising:
   at least one fan device, comprising:
   a frame;
   an impeller, rotatably disposed at the frame;
   a driving component, configured to drive the impeller to rotate relative to the frame; and
   at least one in-built electrical port, disposed at the frame and electrically connected to the driving component; and
   a first attachment device, comprising:
   a first casing, detachably mounted at the frame;
   a first external electrical port, disposed at the first casing and detachably assembled with the at least one in-built electrical port;
   a terminal cable, wherein an end of the terminal cable is electrically connected to the first external electrical port; and
   a single fastener, wherein the frame has a plurality of through holes, the first casing has a first insertion hole, the single fastener is disposed through one of the plurality of through holes of the frame and the first insertion hole of the first casing to fix the first casing to the frame;
   wherein the at least one fan device further comprises a connection cable, the at least one fan device in-built electric port comprises a plurality of in-built electrical ports, the plurality of in-built electrical ports are disposed on different sides of the frame, respectively, and the plurality of in-built electrical ports are electrically connected to the driving component via the connection cable.

2. The fan assembly according to claim 1, further comprising at least one second attachment device, wherein the at least one second attachment device comprises a second casing and two second external electrical ports, the at least one fan device of the fan assembly comprises two fan devices, the second casing of the at least one second attachment device is detachably mounted at the two frames of the two fan devices, and each of the two second external electrical ports is detachably assembled with a respective one of the plurality of in-built electrical ports in each of the two fan devices, respectively.

3. The fan assembly according to claim 2, further comprising at least one double fastener, wherein the at least one double fastener has two engagement protrusions, a second fan frame of the second fan of the two fan devices has a plurality of through holes, the second casing has two second insertion holes, the two engagement protrusions of the at least one double fastener are disposed through two of the plurality of through holes of the two frames of the two fan devices and the two second insertion holes of the second casing, respectively, to fix the second casing to the two frames of the two fan devices.

4. The fan assembly according to claim 3, wherein the fan assembly comprises two double fasteners, and the two double fasteners are engaged with different sides of the two frames of the two fan devices, respectively.

5. The fan assembly according to claim 1, further comprising at least one third attachment device, wherein the at least one third attachment device comprises a third casing and four third external electrical ports, the at least one fan device of the fan assembly comprises four fan devices, the third casing of the at least one third attachment device is detachably mounted at the four frames of the four fan devices, and each of the four third external electrical ports is detachably assembled with a respective one of the plurality of in-built electrical ports in each of the four fan devices, respectively.

6. The fan assembly according to claim 5, further comprising a quadruple fastener, wherein the quadruple fastener has four engagement protrusions, a second frame of the second fan a third frame of the third fan and a fourth frame of the fourth fan of the four fan devices each have a plurality of through holes, the third casing has four third insertion holes, the four engagement protrusions of the quadruple fastener are disposed through four of the plurality of through holes of the four frames of the four fan devices and the four third insertion holes of the third casing, respectively, to fix the third casing to the four frames.

7. The fan assembly according to claim 6, further comprising a double fastener, wherein the double fastener has two engagement protrusions, the two engagement protrusions of the double fastener are engaged with two of the plurality of through holes of any adjacent two of the four frames of the four fan devices, respectively.

8. The fan assembly according to claim 1, wherein the at least one in-built electrical port comprises a circuit board having a conductive metal pad, and the first external electrical port is a circuit board having a conductive metal clip.

* * * * *